(12) United States Patent
 Wang et al.

(10) Patent No.: US 11,086,069 B2
(45) Date of Patent: Aug. 10, 2021

(54) ELECTRONIC DEVICE WITH ILLUMINATION

(71) Applicant: Apple Inc., Cupertino, CA (US)

(72) Inventors: Paul X. Wang, Cupertino, CA (US);
 Bart K. Andre, Palo Alto, CA (US);
 Bryan W. Posner, San Francisco, CA (US); Daniele G. De Iuliis, San Francisco, CA (US); Dinesh C. Mathew, San Francisco, CA (US);
 Kamal H. Habboub, Tampa, FL (US);
 Sung-Ho Tan, San Francisco, CA (US);
 Joshua A. Spechler, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/535,736

(22) Filed: Aug. 8, 2019

(65) Prior Publication Data

US 2020/0081178 A1 Mar. 12, 2020

Related U.S. Application Data

(60) Provisional application No. 62/781,323, filed on Dec. 18, 2018, provisional application No. 62/729,370, filed on Sep. 10, 2018.

(51) Int. Cl.
 *F21V 8/00* (2006.01)
 *H01L 25/13* (2006.01)
 (Continued)

(52) U.S. Cl.
 CPC ......... *G02B 6/0073* (2013.01); *G02B 6/0025* (2013.01); *G02B 6/0083* (2013.01);
 (Continued)

(58) Field of Classification Search
 CPC .. G02B 6/0073; G02B 6/0025; G02B 6/0083; H01L 25/13; H05K 5/04; H05K 7/20145; H05K 7/20172
 See application file for complete search history.

(56) References Cited

U.S. PATENT DOCUMENTS

| 4,321,659 | A | * | 3/1982 | Wheeler | ............... | F21V 29/673 |
| | | | | | | 362/293 |
| 5,947,578 | A | * | 9/1999 | Ayres | ................... | G02B 6/0021 |
| | | | | | | 362/255 |

(Continued)

*Primary Examiner* — Matthew J. Peerce
(74) *Attorney, Agent, or Firm* — Treyz Law Group, P.C.; G. Victor Treyz; Matthew R. Williams

(57) ABSTRACT

An electronic device may have electrical components mounted in an interior region of the electronic device. A housing may surround the interior region and may separate the interior region from an exterior region that surrounds the electronic device. Arrays of recesses may be formed on opposing inner and outer sides of the housing. The arrays may be laterally offset from each other along the housing. The recesses on the inner and outer sides of the housing may meet at passageways within the housing. During operation of the electronic device, air may flow through the inner recesses, the passageways, and the outer recesses to cool electrical components within the interior region. Lighting may be provided for the housing. Light-emitting devices such as light-emitting diodes may be received within cavities in the housing. Light guiding structures, diffusers, reflectors, and other structures may be used to help adjust illumination from the light-emitting devices.

27 Claims, 13 Drawing Sheets

(51) Int. Cl.
*H05K 5/04* (2006.01)
*H05K 7/20* (2006.01)
*G06F 1/20* (2006.01)

(52) U.S. Cl.
CPC ............... *H01L 25/13* (2013.01); *H05K 5/04* (2013.01); *H05K 7/20145* (2013.01); *H05K 7/20172* (2013.01); *G06F 1/203* (2013.01); *G06F 2200/201* (2013.01)

(56) References Cited

U.S. PATENT DOCUMENTS

| | | | |
|---|---|---|---|
| 6,468,491 B1 * | 10/2002 | Foury | B60H 3/06 |
| | | | 180/90 |
| 6,790,003 B1 * | 9/2004 | Hu | F04D 25/0613 |
| | | | 415/118 |
| 6,817,139 B1 * | 11/2004 | Powell | A01M 1/08 |
| | | | 43/113 |
| 7,037,073 B2 * | 5/2006 | Lin | F04D 25/0613 |
| | | | 362/500 |
| 7,712,933 B2 * | 5/2010 | Fleischmann | B60Q 1/50 |
| | | | 362/511 |
| 7,728,799 B2 | 6/2010 | Kerr | |
| 8,177,390 B2 | 5/2012 | Miskin | |
| 8,708,530 B2 * | 4/2014 | Pollack, Jr. | F21V 3/02 |
| | | | 362/294 |
| 9,303,859 B2 * | 4/2016 | Horng | F21V 19/04 |
| 9,789,814 B2 * | 10/2017 | Tanaka | B60Q 1/50 |
| 9,801,970 B2 * | 10/2017 | Chase | A61L 9/12 |
| 10,514,732 B2 * | 12/2019 | Kinstle, III | G06F 1/20 |
| 10,585,463 B1 * | 3/2020 | Huang | H05K 1/147 |
| 2002/0190975 A1 | 12/2002 | Kerr | |
| 2003/0161093 A1 | 8/2003 | Lam et al. | |
| 2004/0156192 A1 | 8/2004 | Kerr et al. | |
| 2016/0040870 A1 * | 2/2016 | Teoh | F21V 15/01 |
| | | | 340/815.45 |
| 2018/0231241 A1 * | 8/2018 | Hung | F04D 29/703 |
| 2019/0249862 A1 * | 8/2019 | Fan | F21V 17/12 |

* cited by examiner

ELECTRONIC DEVICE WITH ILLUMINATION

This application claims the benefit of provisional patent application No. 62/729,370, filed Sep. 10, 2018, and provisional patent application No. 62/781,323, filed Dec. 18, 2018, which are hereby incorporated by reference herein in their entireties.

FIELD

This relates generally to electronic devices, and, more particularly, to illumination for electronic devices.

BACKGROUND

Electronic devices such as laptop computers and other devices may be provided with housings. In some arrangements, portions of a housing may be illuminated.

It can be challenging to illuminate electronic device structures such a housings. For example, it may be difficult to provide an electronic device housing with desired illumination without adversely affecting airflow through the housing or adversely affecting the appearance of the electronic device housing.

SUMMARY

An electronic device may have a housing with an interior region in which electronic components are mounted. The electrical components may include integrated circuits, input-output devices, and other components that generate heat. An exterior region may surround the housing.

Arrays of recesses may be formed on opposing inner and outer sides of the housing. The arrays may be laterally offset from each other along the surfaces of the housing. The recesses on the inner and outer sides of the housing may meet at passageways formed within the housing. During operation of the electronic device, air may flow through the inner recesses, the passageways, and the outer recesses to cool electrical components within the interior region. If desired, a fan may be used to generate air flow through the housing.

The housing may be illuminated to provide the electronic device with a desired appearance and/or to provide status information and other output to a user. For example, light-emitting devices such as light-emitting diodes may emit light that is used to illuminate the housing. The light-emitting devices may be mounted cavities in the housing. Microperforations, light guiding structures, diffusers, reflectors, and other structures may be used to help control emitted light from the light-emitting devices and thereby create a desired pattern of illumination for the electronic device.

DETAILED DESCRIPTION

An electronic device may be provided with illumination. For example, an electronic device may have one or more light sources that emit light for illuminating portions of a housing for the electronic device. The illumination that is provided in this way may be decorative and/or may be used to provide a user of the electronic device with information such as information on the current operating status of the electronic device. As an example, illumination may be adjusted to supply information on whether a device is in a normal operating state, a low power sleep state, a state where maintenance is required, or other information on the current operating state of the electronic device. Illumination may include light of one or more different colors, diffuse illumination, text, icons, flashing lights, light that is spatially and/or temporally patterned to produce desired decorative effects (e.g., chasing lights, gradually diming and strengthening global illumination, etc.) and/or that is spatially and/or temporally patterned to supply users with information (e.g., flashing colors to indicate an urgent condition, light of a particular color to indicate that a message has been received, light with attributes that inform users of the current temperature of a device, and/or other light).

Figure 1:
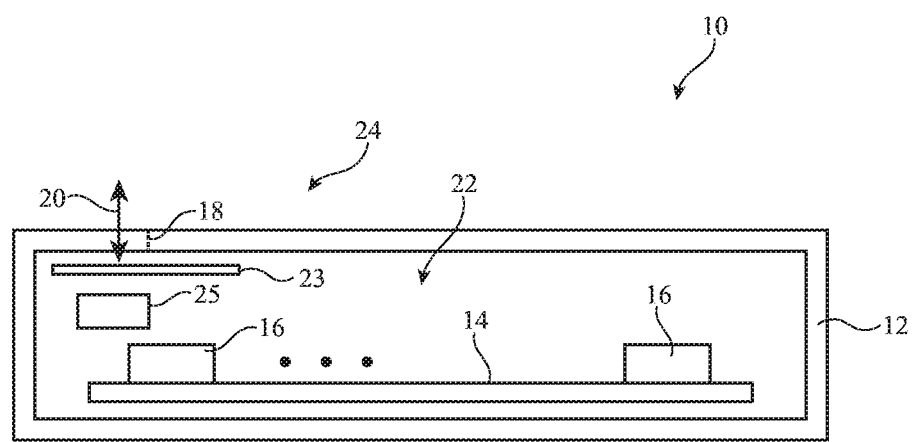
FIG. 1 is a cross-sectional side view of an illustrative electronic device in accordance with an embodiment.

An illustrative electronic device of the type that may be provided with illumination is shown in FIG. 1. Electronic device 10 may be a computing device such as a laptop computer, a computer monitor containing an embedded computer (e.g., an all-in-one computer formed from a display with a desktop stand that has computer components embedded in the same housing as the display), a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, a desktop computer (e.g., a tower computer or other computer without a display, etc.), an embedded system such as a system in which electronic equipment with a display is mounted in a kiosk or automobile, equipment that implements the functionality of two or more of these devices, or other electronic equipment.

As shown in FIG. 1, device 10 may have a housing such as housing 12. Housing 12 may be formed from polymer, metal (e.g., aluminum, stainless steel, steel, etc.), fiber composites such as carbon fiber composites, glass, ceramic, crystalline materials such as sapphire, other materials, and/or combinations of two or more of any of these materials. Housing 12 or parts of housing 12 may be formed using a unibody construction in which housing structures are formed from an integrated piece of material. Multipart housing constructions may also be used in which housing 12 or parts of housing 12 are formed from frame structures, housing walls, and other components that are attached to each other using fasteners, adhesive, and other attachment mechanisms. For example, housing 12 may include housing walls that enclose interior region 22 of device 10 and that separate interior region 22 from exterior region 24, which surrounds device 10 and housing 12.

Components such as electrical components 16 may be mounted on one or more substrates such as printed circuit 14 in interior region 22. Components 16 may include integrated circuits, discrete components such as capacitors, resistors, and inductors, may include power supply components, sensors, communications circuits, and/or other circuitry.

Components 16 may include control circuitry and input-output circuitry. Control circuitry in components 16 may include storage and processing circuitry for supporting the operation of device 10.

The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., wireless local area network transceiver circuitry and antennas, cellular telephone transceiver circuitry and antennas, wired communications circuits, etc.).

The input-output circuitry of components 16 may be used to allow data to be supplied to device 10 and to allow data to be provided from device 10 to external devices. Input-output devices in components 16 may include buttons, joysticks, scrolling wheels, touch pads, key pads, keyboards, microphones, speakers, tone generators, vibrators and other haptic output devices, sensors with digital image sensors such as visible light cameras and other sensors, light-emitting diodes and other status indicators, data ports, etc. A user can control the operation of device 10 by supplying commands through the input-output devices of components 16 and/or the input-output devices of accessory devices (e.g., external keyboards, mice, and/or other input-output devices that communicate with device 10 via wired and/or wireless connections).

A user may receive status information and other output from device 10 using the output resources of the input-output devices. Components 16 may include light-emitting devices (status indicator lights, displays with arrays of pixels such as organic light-emitting diode displays and liquid crystal displays, etc.) and sensors. Device 10 may, for example, include a touch screen display that includes a touch sensor for gathering touch input from a user or a touch insensitive display that is not sensitive to touch. A touch sensor for a display in device 10 may be based on an array of capacitive touch sensor electrodes, acoustic touch sensor structures, resistive touch components, force-based touch sensor structures, a light-based touch sensor, or other suitable touch sensor arrangements. A display may be mounted to face outwardly from one of the sides of device 10 and housing 12 (e.g., a display may be mounted in a display opening on a housing wall). Accessory displays (e.g., computer monitors, etc.) may also be coupled to device 10 via wired and/or wireless connections. Sensors in components 16 may include magnetic sensors, ambient light sensors, force sensors, pressure sensors, microphones, humidity sensors, gas sensors, accelerometers, gyroscopes, capacitive sensors (e.g., capacitive touch sensors and/or capacitive proximity sensors for gathering air gesture input, optical sensors, ultrasonic sensors, and/or other sensors). Sensors may be used in gathering information on the environment surrounding device 10 and may be used in gathering user input.

To help remove heat that is produced by components 16 during operation housing 12 may have one or more openings such as opening 18. For an example, an array of openings may be formed in a housing wall. Components such as fan 25 and/or passive cooling structures may create inward and outward air flow through openings 18, as shown by arrow 20. In this way, heat that is produced in interior region 22 during operation of device 10 can be removed and replaced by cool air from exterior region 24 surrounding device 10.

If desired, some or all of the inner side of housing 12 may be provided with an air-permeable layer such as layer 23 that helps to block dust and other environmental contaminants. Layer 23 may be, for example, a grid-shaped screen or other mesh formed from polymer, metal, and/or other materials. Layer 23, which may sometimes be referred to as an air-permeable dust-blocking layer may be sufficiently permeable to air flow to allow heat to be removed from the interior of device 10 by fan 25 during operation, while helping to block dust and other contaminants from the exterior of device 10 and thereby preventing these contaminants from entering interior region 22. In arrangements in which there are an array of airflow paths through housing 12, layer 23 may overlap some or all of these passageways (e.g., layer 23 may overlap some or all of openings 18 in the example of FIG. 1).

Figure 2:
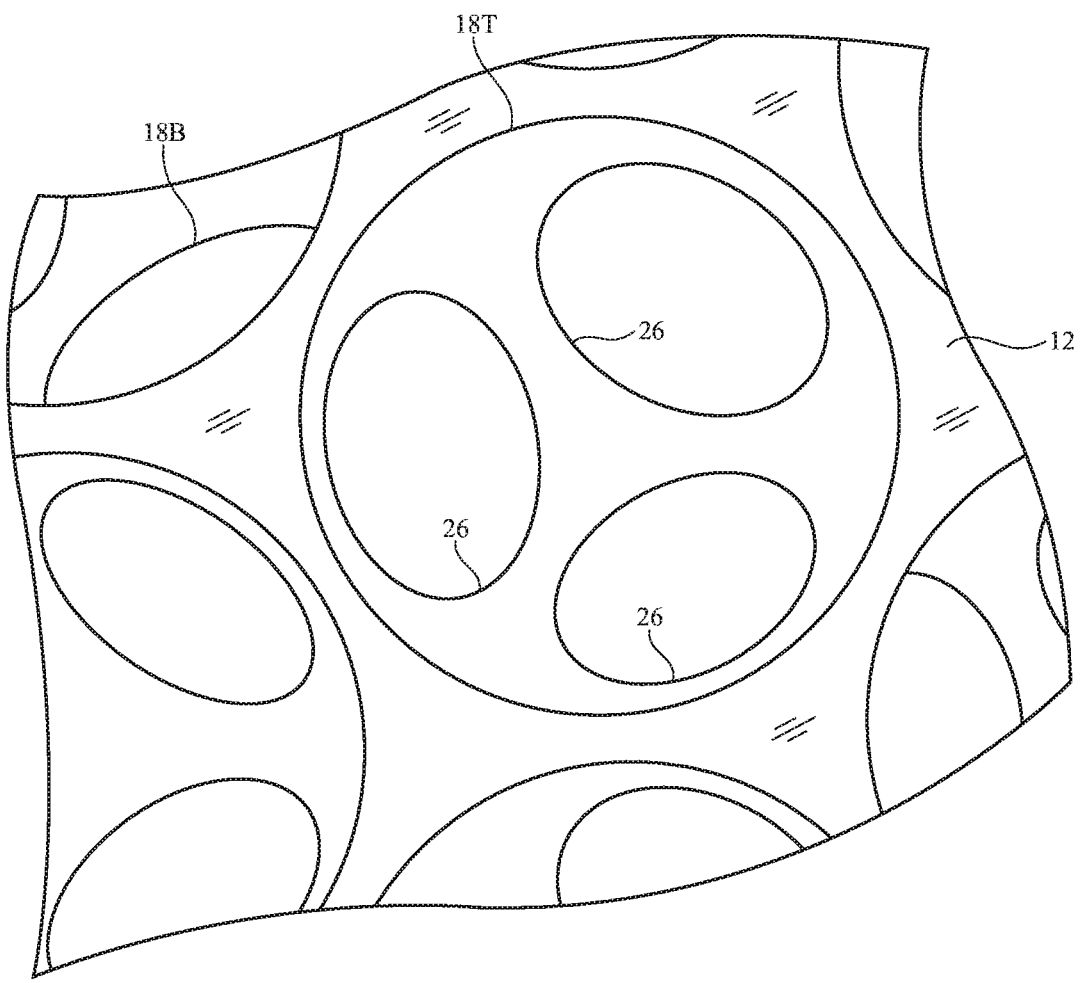
FIGS. 2 and 3 are diagrams of illustrative housing structures with openings in accordance with embodiments.
Figure 3:
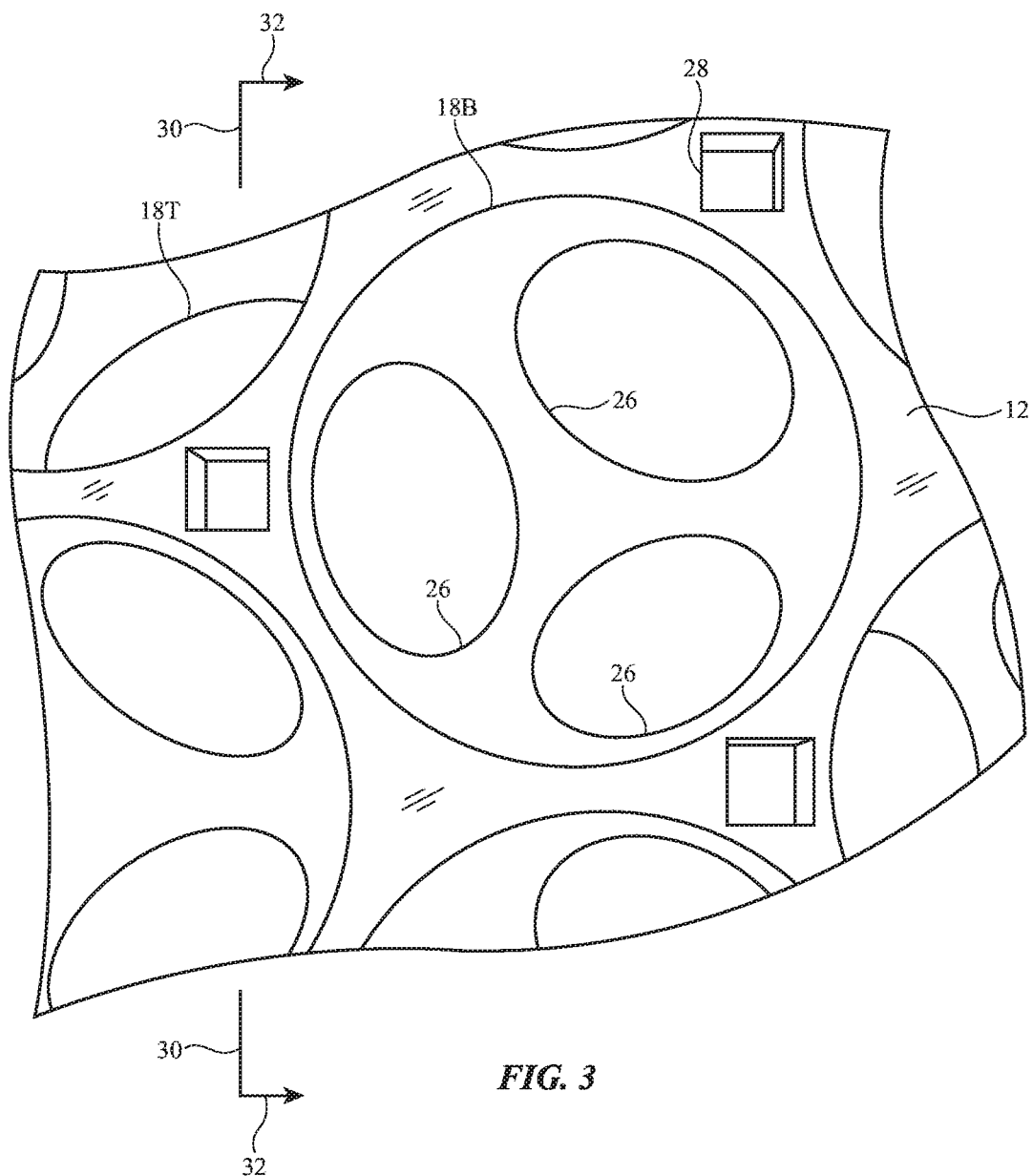

FIGS. 2 and 3 are exterior and interior views, respectively, of an illustrative housing for electronic device 10. As shown in the exterior view of housing 12 of FIG. 2, housing 12 may have an array of outer recesses 18T and an array of inner recesses 18B that are joined by interior passageways 26 (e.g., openings where the outer and inner recesses meet each other). In the example of FIG. 2, the recesses that are formed from the outer side of housing 12 are semispherical in shape and are associated with circular openings at the outer surface of housing 12. The recesses that are formed in housing 12 from the opposing inner side of housing 12 are also semispherical in shape and are associated with circular openings at the inner surface of housing 12. The circular openings on the inner and outer surfaces may have any suitable size. For example, the circular openings on the inner and outer surfaces and the semispherical recesses in housing 12 may have radius values of at least 0.2 cm, at least 0.5 cm, at least 1 cm, at least 1.5 cm, at least 2 cm, at least 3 cm, less than 7 cm, less than 4 cm, less than 2.5 cm, less than 1.8 cm, less than 1.3 cm, or other suitable values.

When viewed from the exterior of device 10, the outer and inner recesses overlap so that passageways 26 are formed between the outer and inner recesses. This creates passageways for air flow from interior region 22 to exterior region 24 (see, e.g., opening 18 of FIG. 1) that pass through housing 12. Although the inner and outer recesses in the example of FIG. 2 are semispherical in shape, recesses of other shapes may be formed, if desired. For example, recesses in housing 12 may have straight walls (e.g., rectangular box shapes), may have walls with multiple facets, may have walls with curved and straight cross-sectional profiles, may have shapes that create openings at the surfaces of housing 12 that are circular, rectangular, triangular, hexagonal, oval, and/or that have combinations of straight and curved edges. The passageways that are formed between the outer and inner recesses may have circular cross sections, may have rectangular cross sections, may have tubular shapes, and/or may have other suitable shapes.

In the illustrative configuration of FIG. 2, recesses 18T are organized in a first array of rows and columns and recesses 18B are arranged in a second array of rows and columns. The pitch (center-to-center spacing) of the outer recesses and the pitch of the inner recesses may be equal (as shown in FIG. 2) to allow the formation of regularly patterned sets of passageways 26. As shown in FIG. 2, the outer and inner recesses may be laterally offset with respect to each other (e.g., laterally offset along the inner and outer surfaces of housing 12 parallel to the plane of a planar housing wall structure formed from housing 12). This helps creates a variety of indirect paths for air flow through housing 12 and creates portions of housing structures 12 that block direct light-of-sight viewing of interior 22 from exterior 24. Air-flow passageways are therefore provided through housing 12 while enhancing the appearance of device 10 when viewed from the exterior of device 10.

As shown in the view of the interior side of housing 12 in the example of FIG. 3, housing 12 may have recesses such as cavities 28 (e.g., in portions of housing 12 that have not been removed when forming inner recesses 18B). Cavities 28 and/or other portions of housing 12 may be configured to receive light-emitting devices that are used in illuminating housing 12.

Figure 4:
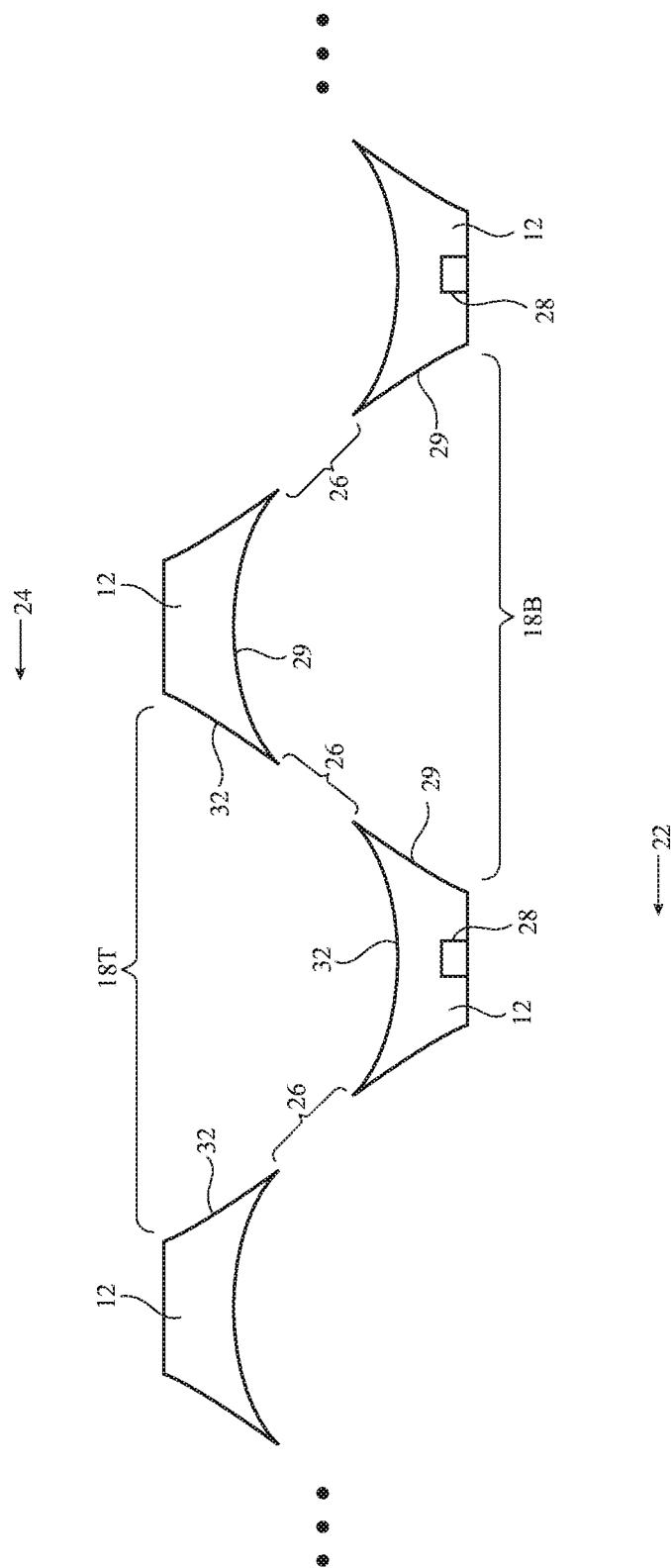
FIG. 4 is a cross-sectional side view of an illustrative electronic device housing with openings in accordance with an embodiment.

A cross-sectional side view of housing 12 of FIG. 3 taken along line 30 and viewed in direction 32 is shown in FIG. 4. As shown in FIG. 4, semispherical inner recesses 18B form circular openings on the inner surface of housing 12 facing interior region 22 and form associated inwardly facing semispherical surfaces 29. Semispherical outer recesses 18T form circular openings on the outer surface of housing 12 facing exterior 24 and form associated outwardly facing semispherical surfaces 32. Passageways 26 allow air to flow between interior 22 and exterior 24 through pathways involving recesses 18B, passageways 26, and recesses 18T. Cavities 28 are formed on the inner planar surface of housing 12 in the example of FIG. 4, but may be formed in other portions of housing 12 (e.g., in surfaces 29 and/or 32, etc.), if desired.

Figure 5:
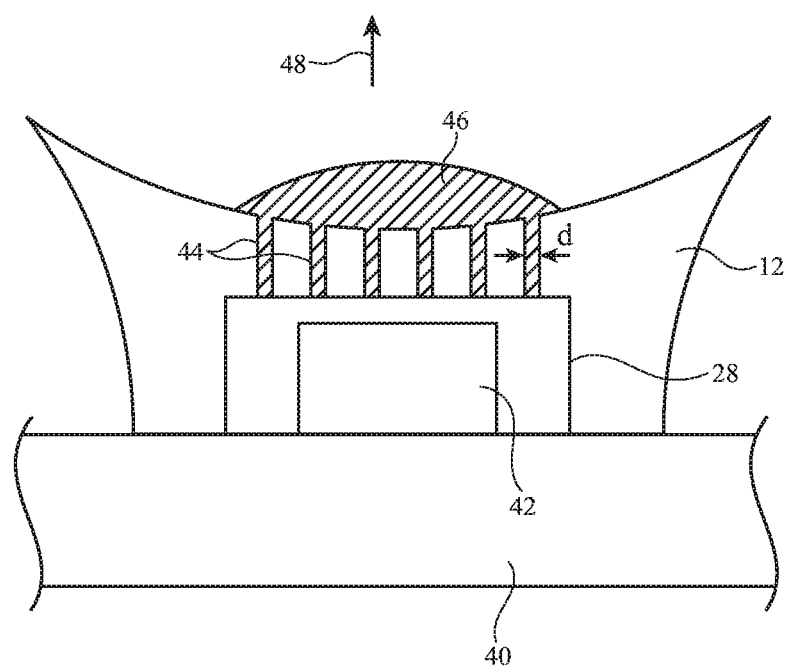
FIG. 5 is a cross-sectional side view of a housing structure with a light-emitting device and an array of perforations in accordance with an embodiment.

FIG. 5 is a cross-sectional side view of a portion of housing 12 showing how light-emitting device 42 may be received within cavity 28. Light-emitting device 42 may be a light-emitting diode, a laser such as a vertical cavity surface emitting laser or other laser diode, and/or other light-emitting component. There may be any suitable number of light-emitting devices 42 in device 10 (e.g., at least 1, at least 2, at least 5, at least 20, at least 80, fewer than 1000, fewer than 200, etc.). Light-emitting devices in device 10 may have different colors. For example, some light-emitting devices 42 may be red (e.g., some devices may emit red light), some may be blue (e.g., some devices may emit blue light), etc.

Each light-emitting device 42 may be controlled individually by the control circuitry of device 10 and/or groups of some or all of light-emitting devices 42 may be controlled together. In the example of FIG. 5, light-emitting device 42 emit light 48 that passes through perforations 44. Perforations 44, which may sometimes be referred to as microperforations or microperfs may have any suitable size. For example, the size of perforations 44 may be sufficiently small to make perforations 44 invisible or nearly invisible to the naked eye of a normal observer. Perforations 44 may be, for example, less than 60 microns in diameter, less than 40 microns in diameter, less than 30 microns in diameter, at least 10 microns in diameter, or other suitable size. The pitch of perforations 44 (e.g., the distance between the centers of respective adjacent perforations 44) may be less than 150 microns, less than 100 microns, less than 80 microns, less than 60 microns, less than 25 microns, at least 20 microns, at least 40 microns, or other suitable pitch. Perforations 44 may be tapered (e.g., so that their upper openings are wider than their lower openings) and/or may have other cross-sectional profiles.

As shown in FIG. 5, perforations 44 may be formed in an array that overlaps light-emitting device 42. The array may contain at least 10 perforations, at least 50 perforations, at least 100 perforations, at least 200 perforations, fewer than 250 perforations, fewer than 130 perforations, fewer than 70 perforations, or fewer than 35 perforations (as examples). The array may contain a single contiguous set of perforations 44 or perforations 44 may be arranged in patterns containing two or sets of perforations 44 (e.g., sets of perforations separated by gaps). Perforations 44 may form an array with a circular outline (footprint when viewed from the exterior of device 10), with a rectangular outline, or an array(s) of other suitable outline(s). Transparent polymer 46 or other material that is transparent to emitted light 48 from light-emitting device 42 may overlap perforations 44 and/or may extend partly or completely into perforations 44 to prevent dust and/or other environmental contaminants from entering perforations 44. Polymer 46 may have a low haze or may incorporate light-scattering particles to raise the haze value of polymer 46 and thereby allow polymer 46 to serve as a diffuser for emitted light 48. Devices 42 may be mounted on substrates such as printed circuit 40 and connected to control circuitry in device 10 by metal traces on printed circuit 40 and/or other signal paths. Printed circuit 40 may be placed adjacent to the inner surface of housing 12 so that light-emitting devices such as device 42 are aligned with and optionally protrude into cavities 28.

Figure 6:
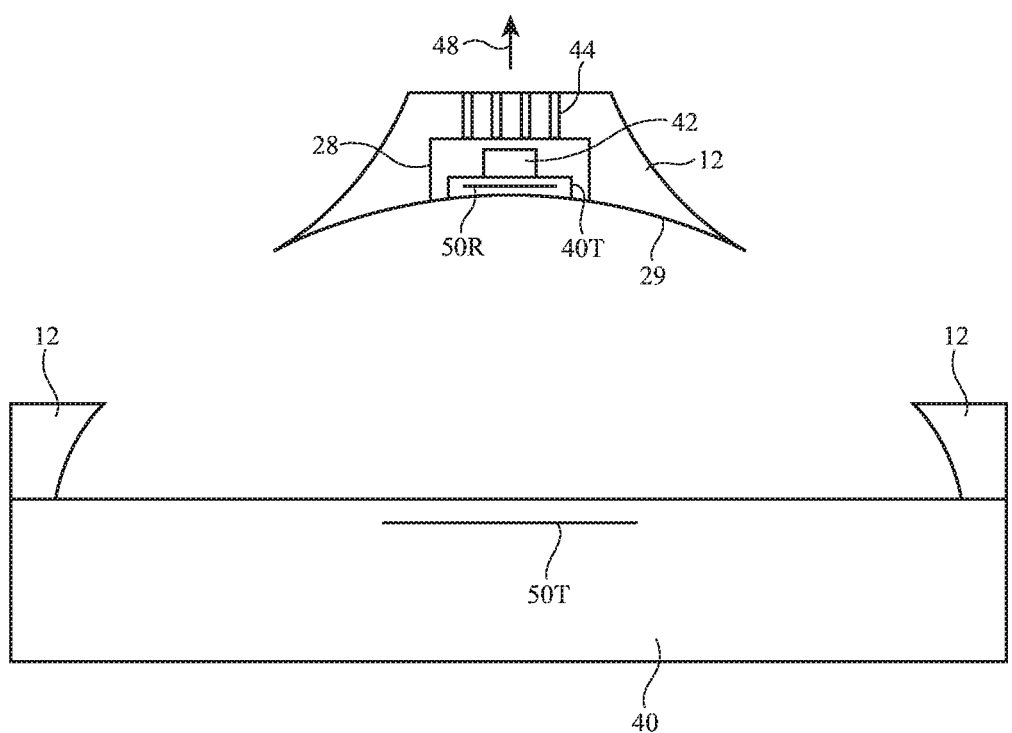
FIG. 6 is a cross-sectional side view of an illustrative electronic device having wireless power transmission components for conveying power to a light-emitting device in accordance with an embodiment.

FIG. 6 is a cross-sectional side view of housing 12 in an illustrative configuration in which printed circuit 40 includes a wireless power transmitting coil such as wireless power transmitting coil 50T. During operation, the control circuitry of device 10 may use transmitting coil 50T to transmit wireless power signals to a corresponding wireless power receiving coil 50R in printed circuit 40T. Printed circuit 40T may be mounted in cavity 28 on inner surface 29 of a portion of housing 12. The power received by receiving coil 50R may be used to power light-emitting device 42 and thereby produce light 48 without using a direct wired path to supply power to light-emitting device 42 (although such a direct wired path may optionally be used). Light 48 may exit housing 12 through perforations 44 that overlap cavity 28 and light-emitting device 42 and/or may exit housing 12 through other light passageways.

Figure 7:
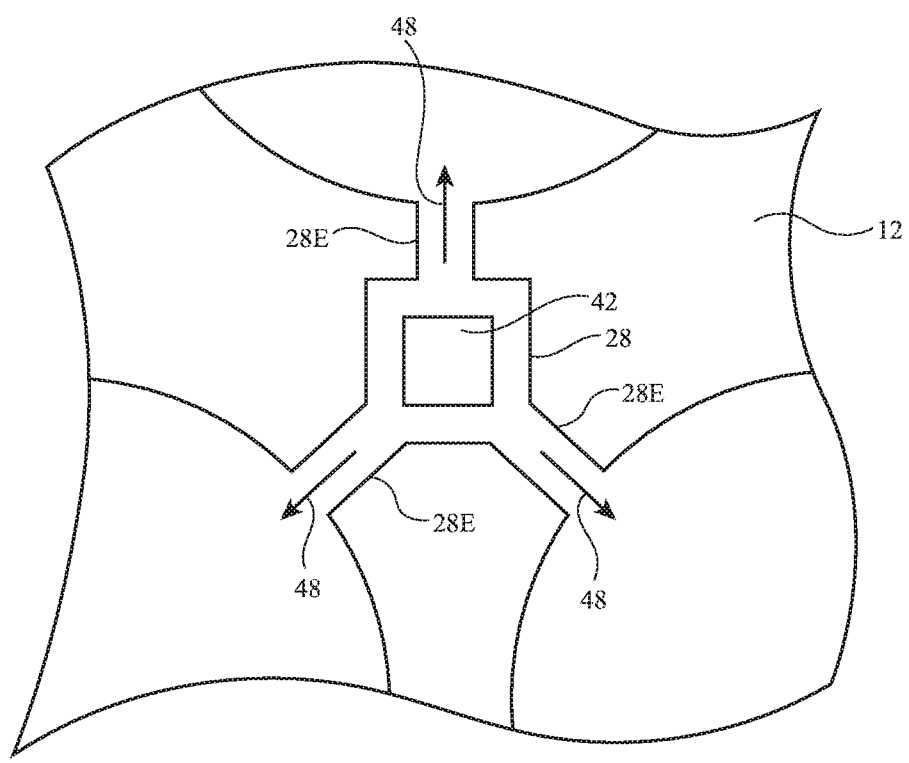
FIG. 7 is a rear view of a portion of an electronic device housing having channels to enhance light distribution from a light-emitting device cavity within the housing in accordance with an embodiment.

FIG. 7 is a view of an illustrative interior surface of housing 12 showing how a cavity such as cavity 28 that is formed on the inner side of housing 12 may have light passageways such as passageways 20E (e.g., channels formed between cavity 28 and the surrounding recesses in housing 12. These openings in housing 12 may help allow emitted light 48 from light-emitting device 42 to pass laterally outward into recesses 18B and 18T.

Figure 8:
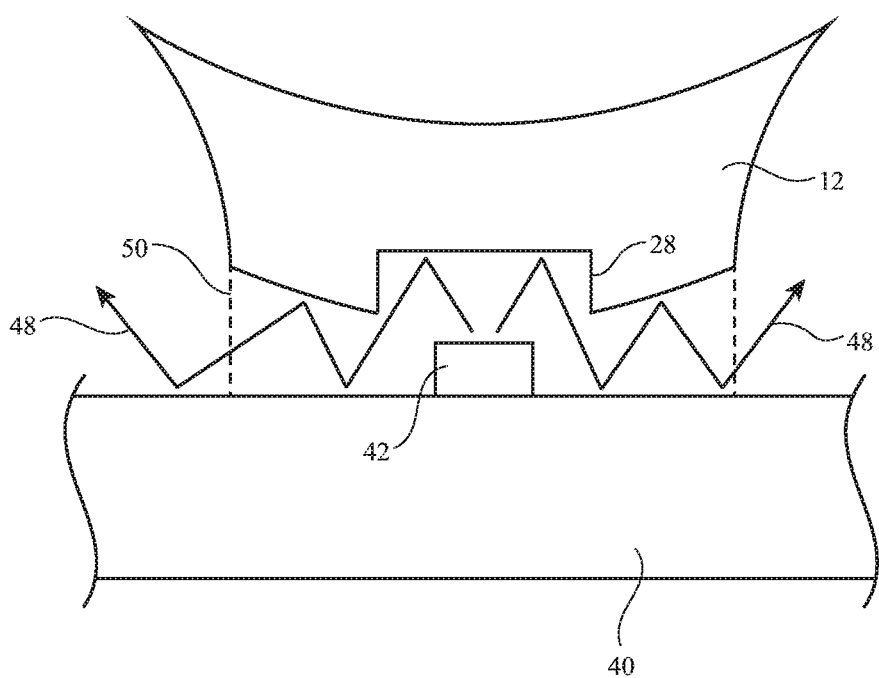
FIG. 8 is a cross-sectional side view of an illustrative portion of an electronic device housing overlapping a light-emitting device on a printed circuit board in accordance with an embodiment.

In the example of FIG. 8, light-emitting device 42 emits light 48 that reflects one or more times from portions of housing 12 and/or the surface of printed circuit 40 while spreading laterally outward from light-emitting device 42 (e.g., while passing through passageways such as passageways 20E of FIG. 7, etc.). If desired, optional transparent material(s) 50 may be formed around light-emitting device 21. Material 50 may be solid or may have a ring shape with an inner opening that receives light-emitting device 42 and may include one or more layers of material, transparent polymer, and/or other material. Material 50 may be a polymer or other material that includes light-scattering particles (e.g., inorganic particles such at titanium dioxide particles), optional colorant (dye and/or pigment), and/or other material (e.g., to form a light diffuser that helps diffuser emitted light 48).

If desired, light guide layers that guide light in accordance with the principal of total internal reflection may be used to help distribute illumination for housing 12. Light guide layers may be formed from transparent polymer or other materials (e.g., transparent polymer films, transparent polymer coatings on housing structures, etc.).

Figure 9:
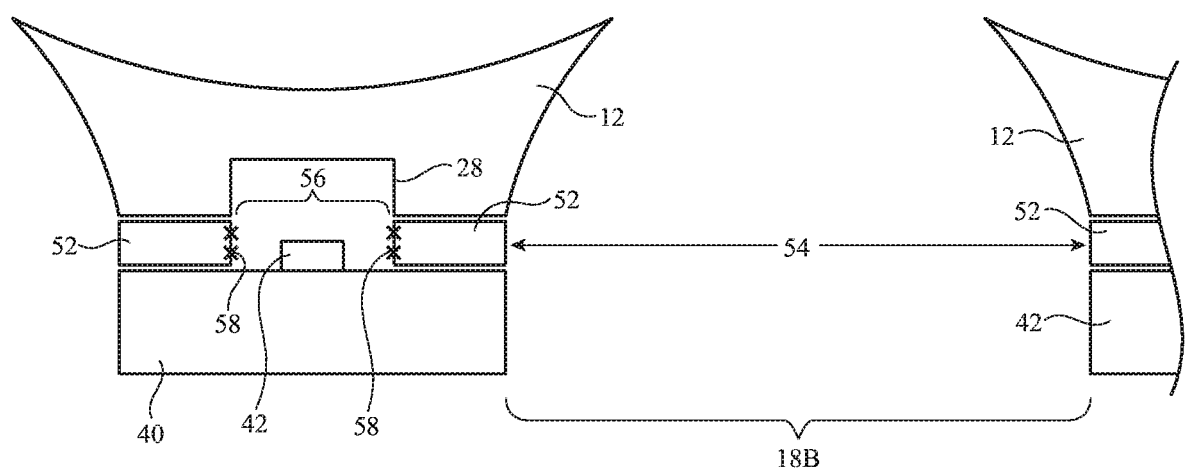
FIG. 9 is a cross-sectional side view of an illustrative housing with openings and a light guide for distributing illumination from light-emitting devices in accordance with an embodiment.

FIG. 9 is a cross-sectional side view of housing 12 in an illustrative configuration in which light guide layer 52 is interposed between printed circuit 40 and the inner surface of housing 12. Openings such as opening 56 may be formed to accommodate light-emitting devices such as device 42. Light-coupling structures 58 (e.g., recesses and/or protrusions and/or other texture) may be provided on the inner surfaces of opening 56 to help couple light that is emitted by device 42 into light guide layer 52. Openings such as opening 56 may, if desired, be aligned with cavities such as cavity 28 in housing 12. Larger openings 54 in light guide layer 52 may be aligned with recesses 18B and may accommodate recesses 18B.

Figure 10:
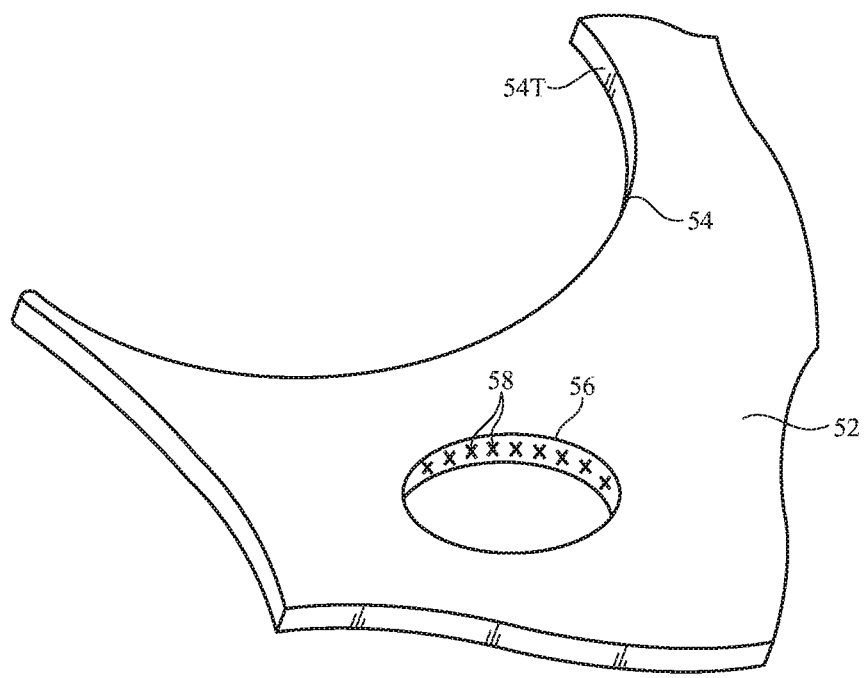
FIG. 10 is a perspective view of an illustrative light guide layer with openings to accommodate light-emitting devices and openings to accommodate an array of housing openings in an electronic device in accordance with an embodiment.

A perspective view of a portion of light-guide layer 52 of FIG. 9 is shown in FIG. 10. During operation, light that has been coupled into layer 52 from devices such as device 42 of FIG. 9 is guided laterally within layer 52 in accordance with the principal of total internal reflection. The inner surfaces of openings 54 such as surface 54T, the inner surfaces of openings 56 and/or other portions of light guide layer 52 may be provided with texture and/or other light-coupling structures 58 to help extract the guided light so that the extracted light may serve as illumination for housing 12 and is visible to a user of device 10.

Figure 11:
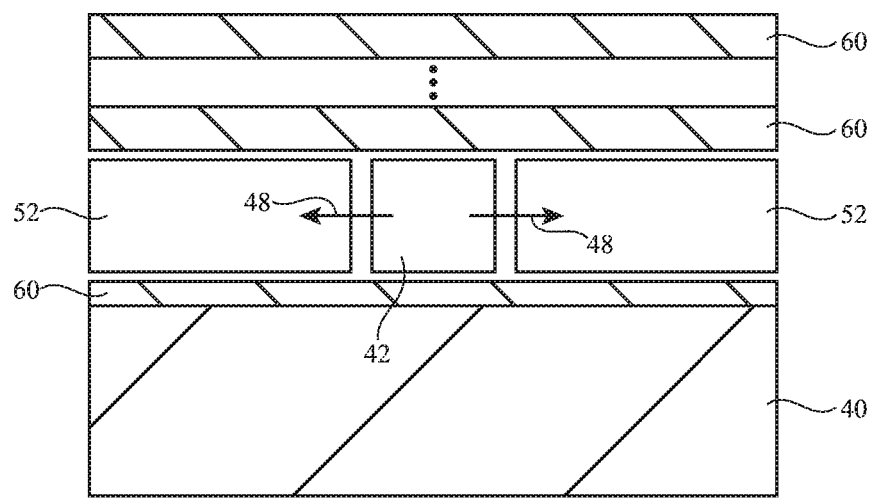
FIG. 11 is a cross-sectional side view of an illustrative light-emitting device and associated layers of material that may be used in distributing light from the light-emitting device to illuminate an electronic device housing in accordance with an embodiment.

FIG. 11 is a cross-sectional side view of illustrative structures that may be used to distribute light emitted by light-emitting device 42. These structures may be located between printed circuit 40 and the inner side of housing 12. As shown in FIG. 11, light-emitting device 42 may emit light 48 into light-guide layer 52. This light may be distributed within light guide layer 52 in accordance with the principal of total internal reflection. Light guide layer 52 may extend parallel to the surfaces of housing 12 and printed circuit 40 (as an example). Light-extraction features such as textured areas on the upper and/or lower surface of layer 52 may extract light from layer 52 to form illumination for housing 12 (e.g., illumination that passes through the recesses and other light paths through housing 12). Layers 60 may be formed above and/or below layer 52. These layers may include coatings on printed circuit 40 (e.g., a reflective layer), may include coatings on layer 52 (e.g., a reflective top or bottom coating), may include separate reflective films (e.g., metallized polymer films and/or polymer films covered with thin-film stacks of dielectric to form reflectors), may include diffuser layers (e.g., a polymer film containing light-scattering particles), and/or other layers of material. Reflective layers may include metal layers and thin-film mirrors formed from reflective thin-film interference filters (e.g., stacks of dielectric layers of alternating refractive index and/or other thin-film mirror structures). Colorant (e.g., dye and/or pigment) may be incorporated into one or more of layers 60 and/or layer 52 to adjust the color of the illumination associated with emitted light 48.

Figure 12:
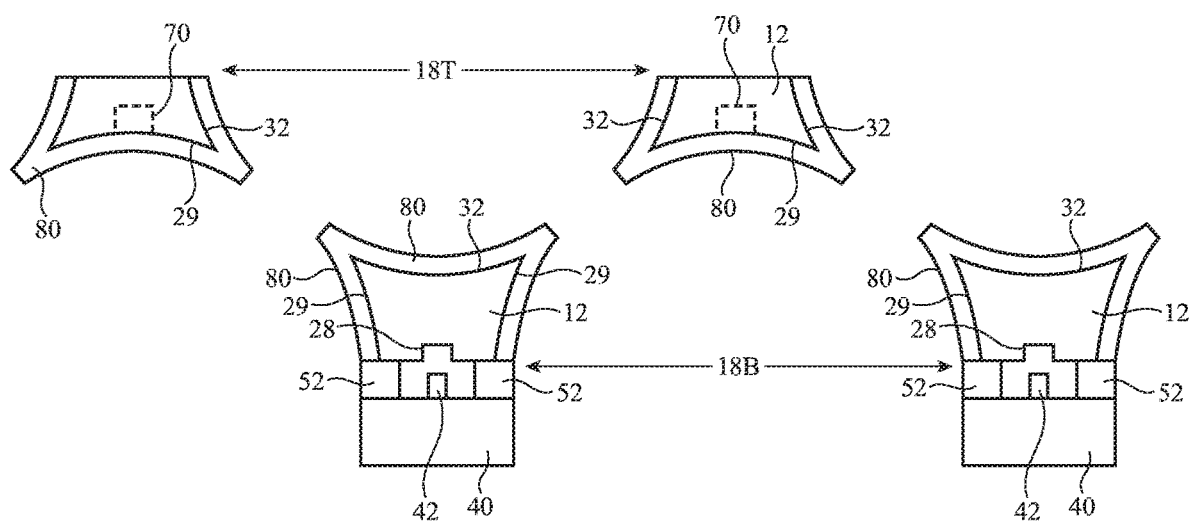
FIG. 12 is a cross-sectional side view of an illustrative electronic device housing structure with light-guiding coating layers for distributing illumination in accordance with an embodiment.

If desired, light guide layers, diffusers, reflective layers, opaque layers, and/or other layers of material may be formed as one or more coating layers on housing 12, as shown by illustrative coating 80 on surfaces 29 and 32 of FIG. 12. Coating 80 may, as an example, be formed from a polymer layer that guides light internally via total internal reflection and thereby serves as a light guide layer (e.g., a light guide coating). Emitted light from light-emitting devices 42 may be coupled into coating 80 through light guide layer 52 and/or other optical coupling structures. If desired, light-emitting devices 42 may be located on surfaces 29 (see, e.g., illustrative recesses 70, which may receive light-emitting devices 42 mounted on printed circuits such as printed circuit 40T to receive wireless power for powering light-emitting devices 42). Texture, light-scattering particles, and/or other light-scattering structures may be incorporated into coatings 80 to help cause light to exit coatings 80 and serve as illumination for device 10. Light-emitting devices 42 may, if desired, include components that emit light of different colors. For example, light-emitting devices 42 on printed circuit 40 may have one color and light-emitting devices 42 in cavities 70 may have another color.

Figure 13:
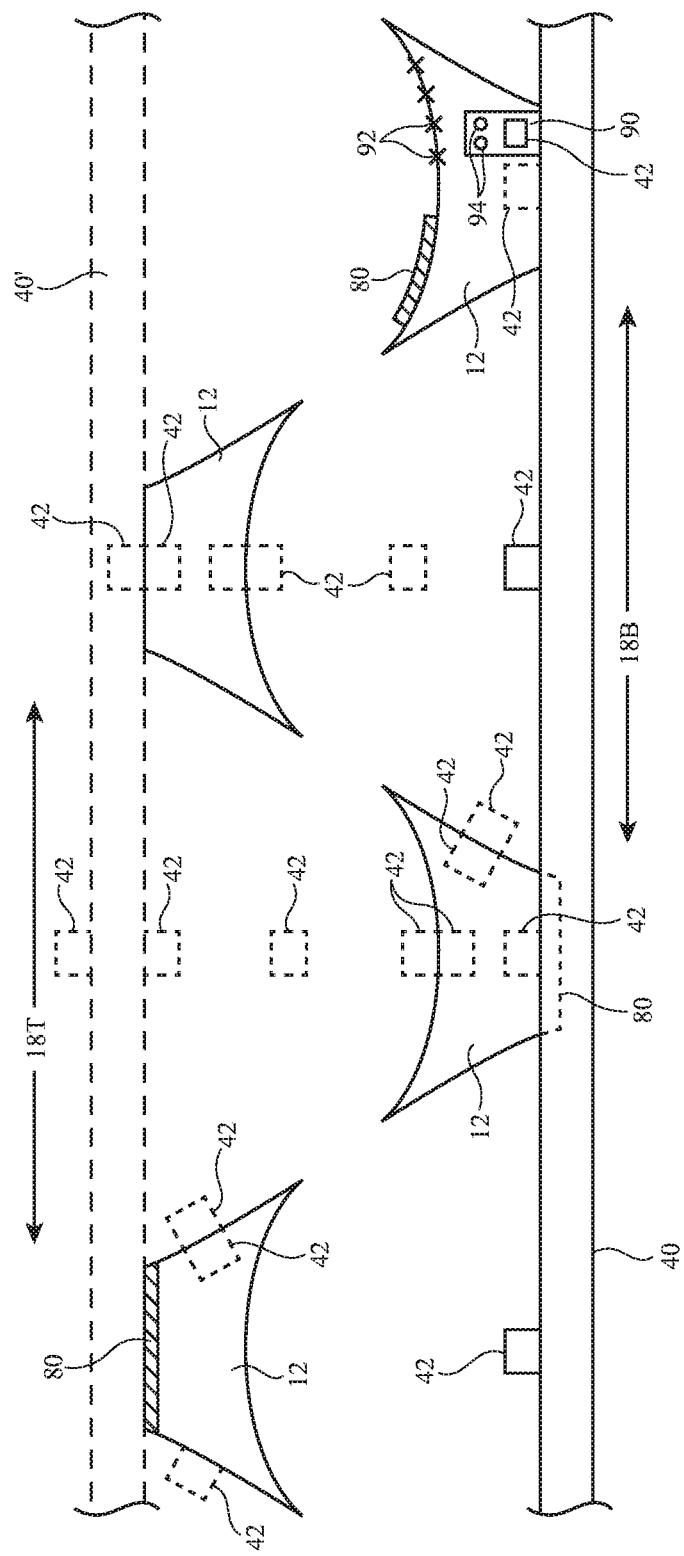
FIG. 13 is a cross-sectional side view of an illustrative electronic device housing structure in accordance with an embodiment.

If desired, housing 12 may be formed from polymer or other dielectric materials. Metal and other materials may optionally be included in a housing that is otherwise formed entirely from polymer (e.g., to provide structural support). In some configurations, wires, printed circuits with metal traces such as printed circuit 40 of FIG. 12, light-emitting devices 42, and/or other circuitry may be embedded in housing 12. For example, devices 42 and signal paths coupled to devices 42 may be embedded in a molded polymer member forming housing 12, as shown by illustrative embedded structures 90 of FIG. 13 and illustrative wires 94 and device 42 in structures 90.

The polymer that forms housing 12 may include transparent polymer and/or may include opaque polymer (e.g., polymer that includes colorant such as dye and/or pigment that imparts a neutral color such as black or gray to housing 12 and/or that imparts a non-neutral color such as yellow, red, blue, or green to housing 12). For example, light guide 52 and the other structures of FIG. 12 such as substrate 30, housing 12, and coating 80 and/or housing structures 12 of FIG. 13 may be implemented using a single shot of molded clear polymer or multiple shots of molded clear (e.g., so that the molded polymer forms a housing and so that devices 42 and other circuitry are embedded within the housing). Polymer for forming housing 12 may have a low haze (e.g., portions of housing 12 may be optically clear) and/or may have a high haze (e.g., portions of housing 12 may have a foggy appearance and may serve as a diffuser that diffuses light from devices 42).

If desired, portions of a molded polymer member may have colorant (e.g., to impart desired colors and opacity to the housing in particular locations). Transparent portions of the housing that are formed from the single shot of molded polymer (or housing structures that are formed using optional additional shots of polymer, coatings, etc.) may be used in forming light guides, light diffusing structures, light extraction structures that help extract light that is being guided within a light guide, optical coupling structures, and/or other optical structures.

Light extraction structures may be molded into the housing that contains embedded components such as devices 42 as part of the molding process being used to form the housing. The light extraction structures may include protrusions such as bumps and/or ridges and recesses such as grooves and/or pits and may be located where indicated by layer 80 of FIG. 12, where indicated by light guide 52 of FIG. 12, and/or in other suitable locations in the housing (see, e.g., illustrative light extraction structures 92 of FIG. 13). In general, a molded polymer housing for device 10 may have openings such as openings 18T and/or 18B of FIG. 12, may have other suitable openings (e.g., through holes such as cylindrical through holes that pass from the outer surface of the housing to an opposing inner surface), may have light extraction features, may have light guiding features, may have cavities and/or other structures that are configured to receive protruding components such as devices 42 mounted on printed circuits such as printed circuit 40 and illustrative printed circuit 40' of FIG. 13 and/or that are configured to receive embedded components (e.g., devices 42 and/or other circuitry that is molded into interior locations within the polymer housing), may have portions that form optical couplers to enhance light coupling between devices 42 and the transparent portions of the housing, may include embedded fibers or other structures that enhance strength (e.g., fiberglass, carbon fibers, metal fibers, fabric, mesh, etc.), may include filler particles for enhancing thermal conductivity and/or adjusting other properties, may have portions that surround devices 42 and/or other components to serve as encapsulation, may have cosmetic coatings, and/or coatings that help extract light, diffuse light, and/or block light, and/or may have other suitable features. Devices 42 may be located in or on any suitable portions of housing 12 and/or printed circuits such as illustrative printed circuit 40 and/or illustrative printed circuit 40' of FIG. 13. For example, devices 42 may be mounted on printed circuits with metal traces forming signal lines, may be coupled to wires, or may be coupled to other signal paths in device 10 that allow devices 42 to receive signals during operation. These mounting locations may be used to place devices 42 in the illustrative locations of FIG. 13 and/or other suitable locations (e.g., on the upper surface of a printed circuit such as printed circuit 40' that is located on the outer surface of housing 12, on the inner surface of printed circuit 40' protruding into openings 18T, in the center of spherical openings 18T and/or 18B or elsewhere in openings 18T and/or 18B, embedded within housing 12, on one or more curved or planar surfaces of housing 12, etc. Devices 42 may be viewed through diffuse portions of housing 12 (e.g., when devices 42 are embedded within diffuse polymer forming housing 12), may be viewed through non-hazy portions of housing 12, may be viewed directly through air without any interposing portions of housing 12 (e.g., when devices 42 are placed in the spherical openings of housing 12 or other openings in housing 12), and/or may be viewed through other portions of device 10. If desired, coatings such as illustrative coatings 80 of FIG. 13 may be opaque (e.g., to selectively block light from devices 42). Coating material may be formed on the outer and/or inner surface of housing 12, on curved portions of housing 12, and/or on other housing surfaces. Configurations in which coating 80 covers all of housing 12 and/or other portions of housing 12 and/or in which coating 80 is transparent or has a non-neutral color (e.g., red, blue, etc.) may also be used. Light-extraction features 92 (e.g., ridges, bumps, or other protrusions, grooves, pits, or other recesses, light scattering particles, etc.) may be formed in coating 80 and/or may be formed from portions of housing 12.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device having an interior region and surrounded by an exterior region, comprising:
    electrical components in the interior region;
    a housing enclosing the interior region, wherein the housing has an outer side that faces the exterior region and an opposing inner side that faces the interior region, wherein the outer side has partially semispherical outer recesses, wherein the inner side has partially semispherical inner recesses that are laterally offset with respect to the outer recesses, wherein the inner recesses and outer recesses have the same center-to-center spacing, and wherein the inner recesses and outer recesses intersect to form passageways that allow airflow between the inner and outer recesses; and
    light-emitting devices configured to emit light that passes through the outer recesses to the exterior region.

2. The electronic device defined in claim 1 wherein the electronic device further comprises a light guide layer, wherein the light-emitting devices are configured to emit light into the light guide layer and wherein light exiting the light guide layer passes through the inner recesses, the passageways, and the outer recesses to the exterior region.

3. The electronic device defined in claim 1 wherein the housing comprises cavities configured respectively to receive the light-emitting devices and wherein the housing comprises perforations that overlap the light-emitting devices.

4. The electronic device defined in claim 3 wherein the perforations are configured to allow the emitted light to pass from the cavities to the outer recesses.

5. The electronic device defined in claim 4 wherein the outer recesses have cross-sectional profiles with curved surfaces.

6. The electronic device defined in claim 1 further comprising a fan configured to cause air to flow from the interior region to the exterior region through the inner recesses, the passageways, and the outer recesses.

7. The electronic device defined in claim 1 further comprising a printed circuit, wherein the light emitting devices comprise an array of light-emitting diodes mounted to the printed circuit and wherein each light-emitting diode is overlapped by a respective portion of the housing to block the light-emitting devices from view from the exterior region.

8. The electronic device defined in claim 7 further comprising a light guide structure configured to receive light from the light-emitting diodes.

9. The electronic device defined in claim 8 wherein the light guide structure comprises a light guide layer having first openings each of which receives a respective one of the light-emitting diodes and has second openings each of which is aligned with a respective one of the inner recesses.

10. The electronic device defined in claim 1 further comprising a light guide coating on the housing, wherein the light-emitting devices are configured to emit light into the light guide coating.

11. The electronic device defined in claim 1 wherein the housing comprises metal, the electronic device further comprising control circuitry configured to adjust the light-emitting devices based on operating status information.

12. The electronic device defined in claim 1 wherein the light-emitting devices comprise light-emitting diodes mounted in an array on a printed circuit board, wherein the electronic device further comprises a light guide layer, wherein the light-emitting devices are configured to emit light into the light guide layer, and wherein light exiting the light guide layer passes through the outer recesses to the exterior region.

13. The electronic device defined in claim 1, wherein the recesses each have a first perimeter and wherein the passageways each have a second perimeter that is smaller than the first perimeter.

14. An electronic device having an interior and an exterior, the electronic device comprising:
    electrical components;
    a fan;
    a metal housing enclosing the electrical components and the fan, wherein the metal housing comprises a first array of recesses that face the interior and a second array of recesses that that face the exterior and that are laterally offset with respect to the first array of recesses, wherein the first and second arrays of recesses comprise partially semispherical recesses, wherein each recess of the first array of recesses intersects a plurality of recesses of the second array of recesses and each recess of the second array of recesses intersects with a plurality of recesses of the first array of recesses to form passageways, and wherein the fan is configured to create air flow that passes between the first array of recesses, the passageways, and the second array of recesses; and light-emitting diodes configured to emit light that passes through the first array of recesses and the second array of recesses.

15. An electronic device, comprising:

a metal housing having outer recesses on an outer side of the metal housing and laterally offset inner recesses on an inner side of the metal housing, wherein the inner and outer recesses are partially semispherical;

a fan that is configured to create air flow through passageways formed by intersections of the inner recesses and the outer recesses;

a light guide layer having first and second openings; and light-emitting diodes that are received within the first openings and that emit light into the light guide layer, wherein the second openings are aligned with the recesses.

16. The electronic device defined in claim 15 further comprising a reflector layer overlapping the light guide layer.

17. The electronic device defined in claim 15, wherein the each of the second openings extend around a perimeter of a recess in the recesses.

18. An electronic device comprising:

electrical components;

a fan;

a housing enclosing the electrical components and the fan, wherein the housing comprises an outer surface and an inner surface of a layer of material that forms a housing wall, wherein the housing wall has a first array of recesses on the inner surface and a second array of recesses on the outer surface that is laterally offset with respect to the first array of recesses, wherein the first array of recesses and the second array of recesses comprise partially semispherical recesses, wherein the recesses of the first array of recesses intersect with the recesses of the second array of recesses to form passageways, and wherein the fan is configured to create air flow that passes through the passageways; and light-emitting diodes that emit light, wherein each light emitting diode is overlapped by a respective recess in the second array of recesses.

19. The electronic device defined in claim 18 wherein the housing comprises a polymer housing.

20. The electronic device defined in claim 19 wherein the light-emitting diodes are embedded within the polymer housing, the electronic device further comprising signal paths that are coupled to the light-emitting diodes, wherein the signal paths include portions that are embedded within the polymer housing.

21. The electronic device defined in claim 19 wherein the light-emitting diodes are mounted in the first array of recesses.

22. The electronic device defined in claim 19 wherein the polymer housing is configured to guide the light emitted by the light-emitting diodes and wherein the polymer housing has light-extraction structures that scatter the guided light out of the polymer housing.

23. The electronic device defined in claim 19 further comprising a coating on the housing.

24. The electronic device defined in claim 23 wherein the coating comprises an opaque coating.

25. The electronic device defined in claim 19 further comprising a printed circuit coupled to the lightemitting diodes.

26. The electronic device defined in claim 25 wherein the light-emitting diodes are mounted adjacent to the outer surface.

27. The electronic device defined in claim 19 wherein a portion of the polymer is configured to form a diffuser that diffuses the light emitted by the light-emitting diodes.

* * * * *